(12) United States Patent
Guenther et al.

(10) Patent No.: US 7,255,823 B1
(45) Date of Patent: Aug. 14, 2007

(54) ENCAPSULATION FOR OLED DEVICES

(75) Inventors: Ewald Karl Michael Guenther, Regenstauf (DE); Mark Dai Joong Auch, Singapore (SG)

(73) Assignees: Institute of Materials Research and Engineering, Singapore (SG); Osram Opto Semiconductor GmbH (DE)

( * ) Notice: Subject to any disclaimer, the term of this patent is extended or adjusted under 35 U.S.C. 154(b) by 348 days.

(21) Appl. No.: 10/363,931

(22) PCT Filed: Sep. 6, 2000

(86) PCT No.: PCT/SG00/00133

§ 371 (c)(1),
(2), (4) Date: Aug. 12, 2003

(87) PCT Pub. No.: WO02/21557

PCT Pub. Date: Mar. 14, 2002

(51) Int. Cl.
*B29C 39/10* (2006.01)
*G02F 1/1339* (2006.01)

(52) U.S. Cl. .............. 264/263; 264/238; 264/272.16; 349/153; 349/190

(58) Field of Classification Search ............. None
See application file for complete search history.

(56) References Cited

U.S. PATENT DOCUMENTS

| | | | |
|---|---|---|---|
| 4,253,741 A * | 3/1981 | Nakauchi et al. | 359/272 |
| 5,041,395 A * | 8/1991 | Steffen | 29/827 |
| 5,577,319 A * | 11/1996 | Knecht | 29/827 |
| 5,610,742 A * | 3/1997 | Hinata et al. | 349/122 |
| 5,687,465 A * | 11/1997 | Hinata et al. | 29/402.01 |
| 5,714,838 A | 2/1998 | Haight et al. | |
| 5,964,030 A * | 10/1999 | Lee et al. | 29/827 |
| 5,965,907 A | 10/1999 | Huang et al. | |
| 6,022,583 A * | 2/2000 | Falcone et al. | 427/96.2 |
| 6,219,126 B1 * | 4/2001 | Von Gutfeld | 349/153 |
| 6,222,603 B1 * | 4/2001 | Sakai et al. | 349/153 |
| 6,399,004 B1 * | 6/2002 | Slager | 264/254 |
| 6,650,392 B2 * | 11/2003 | Iwanaga et al. | 349/153 |
| 6,734,942 B2 * | 5/2004 | Takeuchi | 349/153 |
| 6,791,660 B1 * | 9/2004 | Hayashi et al. | 349/190 |
| 2004/0217703 A1 * | 11/2004 | Wittmann et al. | 313/512 |

FOREIGN PATENT DOCUMENTS

| | | |
|---|---|---|
| EP | 0 986 112 A2 | 3/2000 |
| WO | WO 98/28767 | 7/1998 |
| WO | WO 98/28947 | 7/1998 |
| WO | WO 98/59528 | 12/1998 |
| WO | WO 00/16361 | 3/2000 |
| WO | WO 00/16362 | 3/2000 |

OTHER PUBLICATIONS

Burroughs et al., "Light-emitting diodes based on conjugated polymers", 1990, Nature, vol. 347, 539-541, London, 1990.

* cited by examiner

*Primary Examiner*—Edmund H. Lee
(74) *Attorney, Agent, or Firm*—Fish & Richardson P.C.

(57) ABSTRACT

An encapsulation for an organic light emitting diode (OLED) (201) device is disclosed. The encapsulation includes a sealing dam (280) surrounding the cell region of the OLED device to support a cap. The sealing dam provides a sealing region between the edge of the cap and dam in which an adhesive is applied to seal the OLED device. The use of the sealing dam advantageously enables devices to be formed with narrower sealing widths.

48 Claims, 4 Drawing Sheets

ENCAPSULATION FOR OLED DEVICES

FIELD OF THE INVENTION

The present invention relates to organic light emitting diode (OLED) devices. More particularly, the invention relates to encapsulation of OLED devices.

BACKGROUND OF THE INVENTION

FIG. 1 shows a conventional OLED device 100. OLED devices can be used as displays in various consumer electronic products, including cellular phones, cellular smart phones, personal organizers, pagers, advertising panel, touch screen displays, teleconferencing equipment, multimedia equipment, virtual reality products, and display kiosks.

The OLED device comprises a functional stack of one or more organic functional layers 110 between a transparent conductive layer 105 and a conductive layer 115. The functional stack is formed on a transparent substrate 101. The conductive layers can be patterned to form one or more cells or pixels on the substrate. Bond pads 150 are coupled to the cathodes and anodes to control the OLED pixels. In operation, charge carriers are injected through the cathodes and anodes for recombination in the functional layers. The recombination of the charge carriers causes the functional layer to emit visible radiation.

A cap 160, which forms a cavity 145 between it and the pixels, is mounted on the substrate. A sealant 187 is applied around the edges of the cap where it contacts the substrate. No pressure is applied on the cap, thus allowing the sealant to creep in between the cap and the substrate by capillary force and hermetically sealing the device. However, due to the gap G that exists between the cap and substrate, the sealing width W needs to be sufficiently wide to prevent oxygen and moisture from permeating through the sealant. Typically, the sealing width is about 1-2 mm with a gap of about 0.01-0.1 mm. Such a large sealing width results in inefficient use of chip area, limiting miniaturization of OLED devices.

As evidenced from the above discussion, it is desirable to provide improved encapsulation of OLED devices which reduces the sealing width, control the sealing gap G and provide a cavity to prevent mechanical damage of the active device layers.

SUMMARY OF THE INVENTION

The invention relates generally to OLED devices. In particular, the invention relates to the encapsulation of OLED devices. In one embodiment, a sealing dam surrounding the cell region of the substrate is provided. The sealing dam supports the cap on the substrate and provides a sealing region located at an outer face of the sealing dam. In one embodiment, the sealing region is located between the edge of the cap and dam in which an adhesive is applied to seal the OLED device. The use of the sealing dam determines the gap between the cap and substrate (thereby providing a cavity space between the diode and the cap for mechanical protection) and the sealing widths.

PREFERRED EMBODIMENTS OF THE INVENTION

Figure 2:
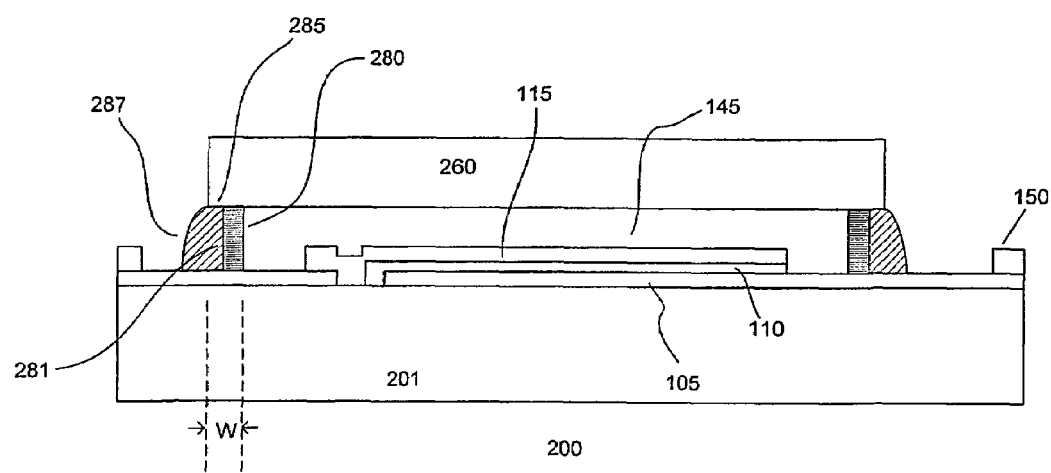
FIG. 2 shows an embodiment of the invention.

FIG. 2 shows an OLED device 200 in accordance with one embodiment of the invention. The OLED device comprises a substrate 201 on which pixels are formed. In one embodiment, the substrate comprises a transparent substrate, such as glass. Other types of transparent materials that serve as a substrate to support the OLED pixels are useful. The OLED pixels comprise one or more organic layers 110 sandwiched between cathodes 105 and anodes 115. In one embodiment, the cathodes and anodes are formed as strips in respective first and second directions. Typically, the first and second directions are orthogonal to each other. The OLED pixels are formed in the cell region of the substrate. Bond pads 150 are electrically coupled to the cathodes and anodes. A cap 260 is provided to encapsulate the OLED pixels. The cap provides a cavity 145, separating the cap from the OLED cells.

Figure 1:
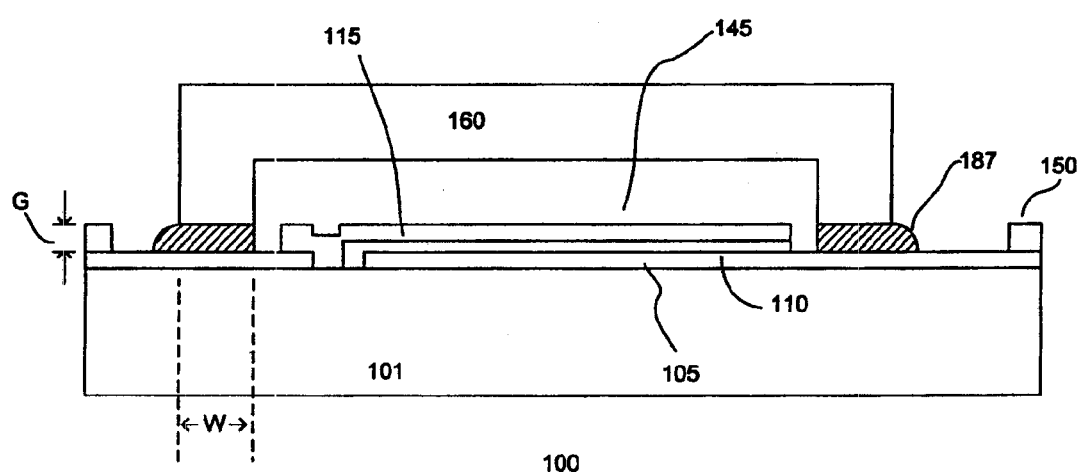
FIG. 1 shows a conventional OLED device.

In accordance with the invention, a sealing dam 280 is provided on the periphery of the cell region of the OLED device to support the cap. The height of the sealing dam defines the cavity 145. In one embodiment, the sealing dam comprises a non-conductive material to prevent shorting of the electrodes. Multi-layered sealing dam in which at least the layer in contact with the substrate comprises a non-conductive material can also be used. The sealing dam forms a sealing space or region 285 which abuts an outer face 281 of the sealing dam. In one embodiment, the sealing dam is located a distance from the edge of the cap, leaving a sealing space 285 between the edge of the cap and the dam. A sealant 287 fills the sealing space, hermetically sealing the device. The use of a sealing dam advantageously eliminates the gap (gap G in FIG. 1) that exists in conventional encapsulations. This enables devices formed with narrower sealing widths, for example, <1 mm. In one embodiment, the sealing width is from about 0.2 to less than 1 mm.

Figure 3:
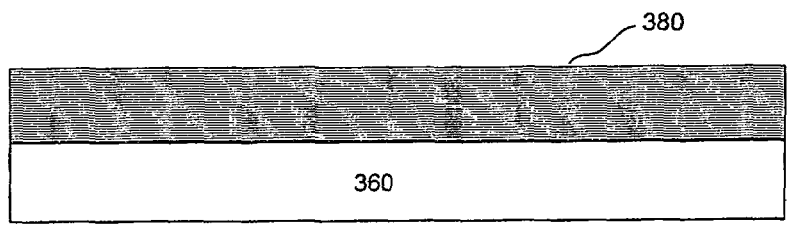
FIGS. 3-5 show a process for fabricating an OLED device in accordance with one embodiment of the invention.

FIGS. 3-6 show a process for fabricating an OLED device in accordance with one embodiment of the invention. Referring to FIG. 3, a substrate 360 which serves as an encapsulation cap is provided. The substrate comprises, for example, metal or glass. Other types of materials which can protect the active components from the environment, such as ceramic or metallized foil, are also useful. The thickness of the substrate can be, for example, 0.4-2 mm. Providing a thin substrate (0.01-0.2 mm) is also useful, particularly for fabricating flexible devices.

A device layer 380 from which the sealing dam is formed is deposited on a major surface of the cap. In one embodiment, the device layer comprises a non-conductive photosensitive material, such as photoresist. Other non-conductive photosensitive materials, such as photopatternable polyimide, photopatternable polybenzoxazole, photopatternable polyglutarimide and other resins, are also useful. The height of the dam (e.g. 1 um) is larger than the height of the device layer (ca. 0.5 um).

Figure 4:
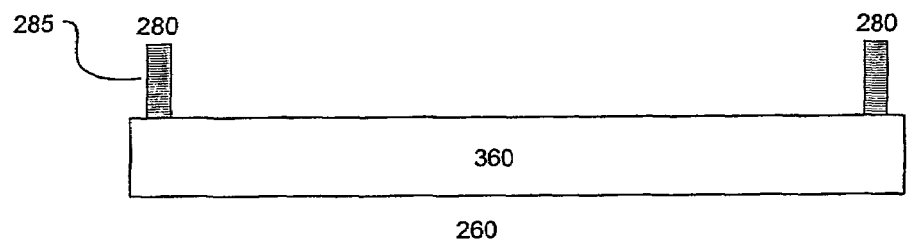

Referring to FIG. 4, the device layer is patterned to form a sealing dam 280. The patterning process includes, for example, selectively exposing the resist layer followed by a development process to remove the selected portions (i.e., exposed or unexposed portions are removed depending on the use of a positive or negative resist layer). In one embodiment, the sealing dam is formed a distance from the edge of the substrate 260, leaving a sealing region 285.

Typically the sealing region is about 0.2-2 mm wide. The dam and substrate form a cap 260 to encapsulate the OLED device.

Alternatively, non-photosensitive materials that are non-conductive, such as spin-on glass, polyimide, polybenzoxazole, polyglutarimide, or benzocyclobutene, can be used to serve as the sealing dam layer. Other non-photosensitive materials such as polymers, including polyethylene, polystyrene, polypropylene or inorganic materials such as silicon oxide, silicon nitride, aluminum oxide are also useful. For non-photosensitive materials, an etch mask, such as resist, is provided for patterning the device layer.

In yet another embodiment, multiple layers are used to form a sealing dam stack. At least the upper most layer which contacts the OLED substrate comprises a non-conductive material. The layers are patterned using, for example, an etch mask to form the sealing dam.

Figure 5:
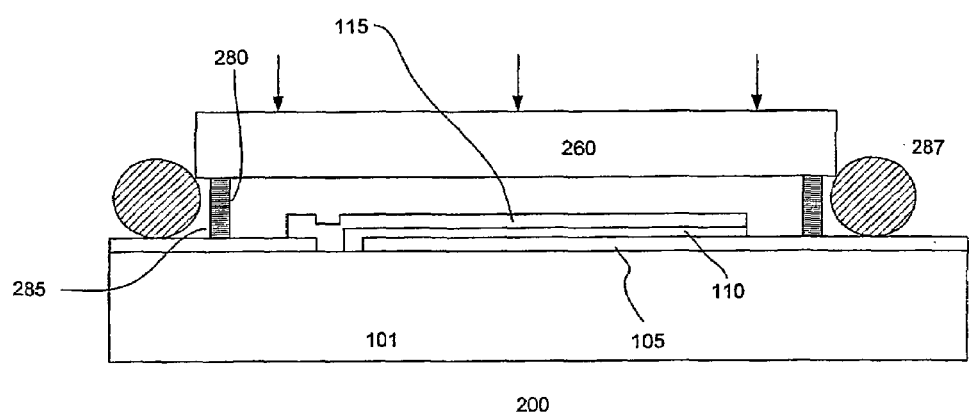

Referring to FIG. 5, a substrate 101 comprising OLED cells formed thereon is provided. In one embodiment, the substrate comprises a transparent material, such as glass. Other types of material can also be used to form the substrate. In a preferred embodiment, the substrate comprises a transparent flexible substrate, such as thin glass (e.g. 50 um) or other materials such as plastic films, including, for example, transparent poly(ethylene terephthalate) (PET), poly(butylenes terephthalate) (PBT), poly(enthylene naphthalate) (PEN), polycarbonate (PC), polyimides (PI), polysulfones (PSO), and poly (p-phenylene ether sulfone) (PES), polyethylene (PE), polypropylene (PP), poly(vinyl chloride) (PVC), polystyrene (PS) or poly(methyl methyleacrylate) (PMMA). In one embodiment, the substrate is about 20-300 um thick.

The OLED cells are formed in the cell region of the substrate. The OLED cells comprise a stack of layers, which includes first and second electrodes 105 and 115 with at least one organic functional layer 110 therebetween. Fabrication of OLED cells is described in, for example, Burroughes et al., Nature (London) 347, 539 (1990) which is herein incorporated by reference for all purposes. Bond pads (not shown), for example, can be provided to access the OLED cells.

The cap 260 is mounted on the substrate with the OLED pixels, aligning the sealing dam 280 to surround the cell region of the OLED device. Pressure is applied to the cap and/or substrate 101 to press them together to avoid the sealant creeping into the gap between the sealing dam and the substrate. A sealant 287 is applied on the substrate around the cap. The sealant can comprise an adhesive, such as, a UV-curable epoxy. Other types of sealants, such as heat curable epoxies or acrylates, are also useful. The sealant creeps in to fill the sealing region 285 between the cap and substrate. The sealant is cured (e.g., UV or thermal), thus hermetically sealing the OLED pixels.

EXAMPLE

A 1 um thick layer of AZ 5214E photoresist was deposited onto a glass substrate. The glass substrate was about 22 mm$^2$ and 100 um thick. A Karl Suess RC 8 spin-coater was used to deposit the photoresist (about 1000 rpm for about 20 seconds). Subsequently, the resist was baked at 90° C. for about 2 min to remove the solvent, resulting in a dry resist film of about 1.2 um thick. The dry resist film is selectively exposed with a 50 MJ/cm$^2$ dose of UV light using a Karl Suess MJB 3 contact-exposing system.

After exposure, the resist was developed in AZ 726 alkaline developer for about 1 minute at room temperature. The exposed regions of the resist were dissolved, leaving the sealing dam on the substrate. The cap (substrate with the dam) was then mounted on a prepared substrate with OLED pixels. An adhesive was dispensed along the edges of the dam, encapsulating the device. In another experiment, prior to mounting the cap onto the prepared OLED substrate, it was baked at about 220° C. for about 1 hour to cross-link the resist. Cross-linking improves adhesion as well as rendering the resist inert to, for example, solvents that are used in subsequent processing.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
    a substrate having a cell region;
    a sealing dam surrounding the cell region;
    a cap supported by the sealing dam;
    a sealing region abutting an outer surface of the sealing dam; and
    a sealant located in the sealing region, the sealant hermetically sealing the device, wherein the sealing dam includes at least one material from a group consisting of photoresist, spin-on glass, polyimide, polybenzoxazole, polyglutarimide, benzocyclobutene, polyethylene, polystyrene, polypropylene, silicon nitride and aluminum oxide.

2. The device of claim 1 wherein the cell region comprises organic light emitting diode cells.

3. The device of claim 1 wherein the sealant comprises an adhesive.

4. The device of claim 1 wherein the cap extends past the sealing dam to provide an overhang, and the sealant spans a space between the overhang and the substrate.

5. The device of claim 1 wherein the sealing dam abuts the substrate.

6. The device of claim 1 wherein the substrate comprises a flexible substrate.

7. The device of claim 6 wherein the substrate comprises a transparent substrate.

8. The device of claim 1 wherein the substrate comprises a transparent substrate.

9. The device of claim 1 wherein the sealing dam comprises a non-conductive material.

10. The device of claim 9 wherein the sealant comprises a thermally cured sealant.

11. The device of claim 9 wherein the sealing dam comprises a photosensitive material.

12. The device of claim 11 wherein the sealant comprises a thermally cured sealant.

13. The device of claim 9 wherein the sealing dam comprises multiple layers.

14. The device of claim 13 wherein at least a bottom layer of the sealing dam in contact with the substrate comprises non-conductive material.

15. The device of claim 14 wherein the sealant comprises a thermally cured sealant.

16. The device of claim 13 wherein the sealant comprises a thermally cured sealant.

17. A method for forming a device including encapsulating the device comprising:
    providing a substrate including a cell region;

providing a cap with a sealing dam;
mounting the cap on the substrate, wherein the sealing dam surrounds the cell region and forms a sealing region abutting an outer surface of the sealing dam;
exerting a pressure to ensure the sealing dam contacts the substrate; and
applying a sealant in the sealing region, the sealant hermetically sealing the cell region, wherein the sealing dam includes at least one material from a group consisting of photoresist, spin-on glass, polyimide, polybenzoxazole, polyglutarimide, benzocyclobutene, polyethylene, polystyrene, polypropylene, silicon nitride and aluminum oxide.

18. The method of claim 17 wherein providing the substrate includes forming organic light emitting diode cells in the cell region of the substrate.

19. The method of claim 17 wherein the sealant comprises an adhesive.

20. The method of claim 17 wherein the cap extends past the sealing dam to provide an overhang, and the sealant spans a space between the overhang and the substrate.

21. The method of claim 17 wherein the sealing dam abuts the substrate.

22. The method of claim 17 wherein the substrate comprises a flexible substrate.

23. The method of claim 22 wherein the substrate comprises a transparent substrate.

24. The method of claim 17 wherein the substrate comprises a transparent substrate.

25. The method of claim 17 wherein providing the cap with the sealing dam comprises forming a sealing dam on a cap substrate.

26. The method of claim 25 further comprising curing the sealant.

27. The method of claim 25 wherein forming the sealing dam comprises:
depositing a device layer on the cap substrate; and
patterning the device layer to form the sealing dam on the cap substrate.

28. The method of claim 27 further comprising curing the adhesive.

29. The method of claim 27 wherein the device layer comprises a photosensitive layer.

30. The method of claim 29 further comprising curing the sealant.

31. The method of claim 25 wherein the sealing dam comprises a photosensitive material.

32. The method of claim 31 further comprising curing the sealant.

33. A method for forming a device including encapsulating the device comprising:
providing a substrate including a cell region;
forming a sealing dam on the substrate, wherein the sealing dam surrounds the cell region;
mounting a cap on the sealing dam, wherein a sealing region abuts an outer surface of the sealing dam;
exerting a pressure to ensure the cap contacts the sealing dam; and
applying a sealant in the sealing region, the sealant hermetically sealing the cell region,
wherein the sealing dam includes at least one material from a group consisting of photoresist, spin-on glass, polyimide, polybenzoxazole, polyglutarimide, benzocyclobutene, polyethylene, polystyrene, polypropylene, silicon nitride and aluminum oxide.

34. The method of claim 33 wherein providing the substrate includes forming organic light emitting diode cells in the cell region of the substrate.

35. The method of claim 33 wherein the sealant comprises an adhesive.

36. The method of claim 33 wherein the cap extends past the sealing dam to provide an overhang, and the sealant spans a space between the overhang and the substrate.

37. The method of claim 33 wherein the sealing dam abuts the substrate.

38. The method of claim 33 wherein the substrate comprises a flexible substrate.

39. The method of claim 38 wherein the substrate comprises a transparent substrate.

40. The method of claim 33 wherein the substrate comprises a transparent substrate.

41. The method of claim 33 wherein forming the sealing dam comprises:
depositing a device layer on the substrate; and
patterning the device layer to form the sealing dam on the substrate.

42. The method of claim 41 wherein the device layer comprises a photosensitive layer.

43. The method of claim 42 further comprising curing the sealant.

44. The method of claim 41 further comprising curing the sealant.

45. The method of claim 33 wherein the sealing dam comprises a photosensitive material.

46. The method of claim 45 further comprising curing the sealant.

47. The device of claim 1 further comprising a cavity configured to separate the cap from the cell region, the cavity being positioned adjacent to an inner surface of the sealing dam.

48. The device of claim 1 further comprising a cavity configured to separate the cap from a cell positioned in the cell region.

* * * * *

UNITED STATES PATENT AND TRADEMARK OFFICE
CERTIFICATE OF CORRECTION

PATENT NO. : 7,255,823 B1 Page 1 of 1
APPLICATION NO. : 10/363931
DATED : August 14, 2007
INVENTOR(S) : Ewald Karl Michael Guenther and Mark Dai Joong Auch It is certified that error appears in the above-identified patent and that said Letters Patent is hereby corrected as shown below:

On the Title Page, Assignees (73); replace:
 "Osram Opto Semiconductor GmbH (DE)" with
 -- Osram Opto Semiconductors GmbH (DE) --

On the Title Page, Abstract (57); line 2, replace:
 "(OLED) (201) device is disclosed. The encapsulation" with
 -- (OLED) device is disclosed. The encapsulation --

On the Title Page, Abstract (57); line 3, replace:
 "includes a sealing dam (280) surrounding the cell region of" with
 -- includes a sealing dam surrounding the cell region of --

Signed and Sealed this

Twenty-ninth Day of April, 2008

JON W. DUDAS
*Director of the United States Patent and Trademark Office*